United States Patent [19]

Hollyday

[11] 4,265,506

[45] May 5, 1981

[54] FILTERED CONNECTOR ASSEMBLY

[75] Inventor: Robert D. Hollyday, Elizabethtown, Pa.

[73] Assignee: AMP Incorporated, Harrisburg, Pa.

[21] Appl. No.: 67,270

[22] Filed: Aug. 17, 1979

[51] Int. Cl.3 ..................... H01R 13/66; H01R 33/80; H03H 7/09

[52] U.S. Cl. ................................ 339/147 R; 333/182; 333/183; 339/276 R

[58] Field of Search ................. 339/14 R, 147 R, 143, 339/276 R; 333/182, 183

[56] References Cited

U.S. PATENT DOCUMENTS

| | | | |
|---|---|---|---|
| 2,451,393 | 10/1948 | Kershaw | 339/276 R X |
| 3,065,447 | 11/1962 | Maurer | 339/184 M |
| 3,101,229 | 8/1963 | Yopp | 339/59 M |
| 3,566,336 | 2/1971 | Johnson et al. | 339/91 R |
| 3,573,677 | 2/1971 | Detar | 333/183 |
| 3,840,841 | 6/1973 | Clark | 339/147 P |
| 3,854,107 | 12/1974 | Tuchto et al. | 339/147 R X |
| 3,961,294 | 6/1976 | Hollyday | 333/182 |
| 4,126,840 | 11/1978 | Selvin | 333/175 |

FOREIGN PATENT DOCUMENTS

| | | | |
|---|---|---|---|
| 2800745 | 7/1978 | Fed. Rep. of Germany | 339/147 R |

*Primary Examiner*—Eugene F. Desmond
*Attorney, Agent, or Firm*—Richard B. O'Planick

[57] ABSTRACT

A filtered connector assembly is disclosed for retrofit insertion between a mated connector pair, or for use in original equipment design. The assembly comprises a ground plate having a plurality of filter pin members mounted therethrough, hermaphroditic mounting plates assembled to alternate faces of the ground plate, and dielectric insert members received within profiled portions of each mounting plate for electrically insulating the filter pin members disposed therein.

13 Claims, 6 Drawing Figures

FILTERED CONNECTOR ASSEMBLY

BACKGROUND OF THE INVENTION

1. Field of the Invention

The present invention relates to filtered connector assemblies for retrofitting filtering capability between existing mating connectors, or for use as a feedthrough assembly in original equipment design.

2. The Prior Art

In many electrical applications filtering capability is desirable for selective attenuation of unwanted portions of a signal; however, such capability may not have been incorporated into the original design. Resultingly, many interconnections currently are made in situations where filtering capability would be highly desirable, yet economics prevent a wholesale redesign of the system. For such situations, filtered adapter assemblies are used to retrofit a filtering potential into the existing system. Likewise, designers of new systems have need of a filtered connector assembly for incorporating filtering capability into a given design at the outset.

Achievement of an acceptable filtered connector assembly has heretofore been elusive due to the myriad demands placed upon any proposed assembly. For example, a filtered adapter must be inexpensive since it would be inconsistent to retrofit expensive filtered devices into a system in order to avoid a costly redesign. Moreover, since different-sized filter elements are required for different electrical characteristics, it is critical that any proposed assembly have the versatility to accommodate filter elements have physical dimensions variable within a specified range. Also, an ease of assembly is desirable, and the filtered adapter assembly should require minimal potting in order to enhance ease of assembly as well as to achieve a uniform seal. Still further, the mounting surfaces of a suitable filtered connector assembly must be planar, a necessity in order for a filtered product to operate effectively.

SUMMARY OF THE PRESENT INVENTION

A filtered connector assembly is disclosed having application either as an adapter for retrofit insertion between mated connectors, or as a feedthrough assembly in original equipment design. The assembly comprises a ground plate having a plurality of filter pin members seated therein, two hermaphroditic mounting plates in parallel abutment against opposite faces of the ground plate, a pair of dielectric inserts each receivable in a respective mounting plate to electrically insulate the filter pin members therein, and a plurality of latching-ejector members. Each filter-pin member consists of a filter sleeve having a length variable within limits, through which a stepped-profiled pin is received. An assembly slot and mounting aperture are provided at each end of the ground plate, and each mounting plate is configured having integral tab means at each end for insertion through the ground plate slots. The dielectric inserts are received within external hood portions of the mounting plates a fixed distance, and bottom against the ground plate.

Accordingly, it is an object of the present invention to provide a filtered connector assembly suitable for retrofit insertion between mated connectors, or for use as a feedthrough assembly in original equipment design.

A further object is to provide a filtered connector assembly capable of accommodating a plurality of filter elements, each optionally having a dimension variable within limits.

Yet a further object of the present invention is to provide a filtered connector assembly having substantially flat mounting surfaces.

Still further, an object of the present invention is to provide a filtered connector assembly having a uniformly planar dielectric seal.

A still further object of the present invention is to provide a filtered connector assembly which is economically and readily produced, and readily assembled.

These and other objects of the present invention, which will be apparent to one skilled in the art, are illustrated by a preferred embodiment which is described in detail below, and illustrated in the acoompanying drawings.

BRIEF DESCRIPTION OF THE ACCOMPANYING DRAWINGS

DETAILED DESCRIPTION OF THE PREFERRED EMBODIMENT

Figure 1:
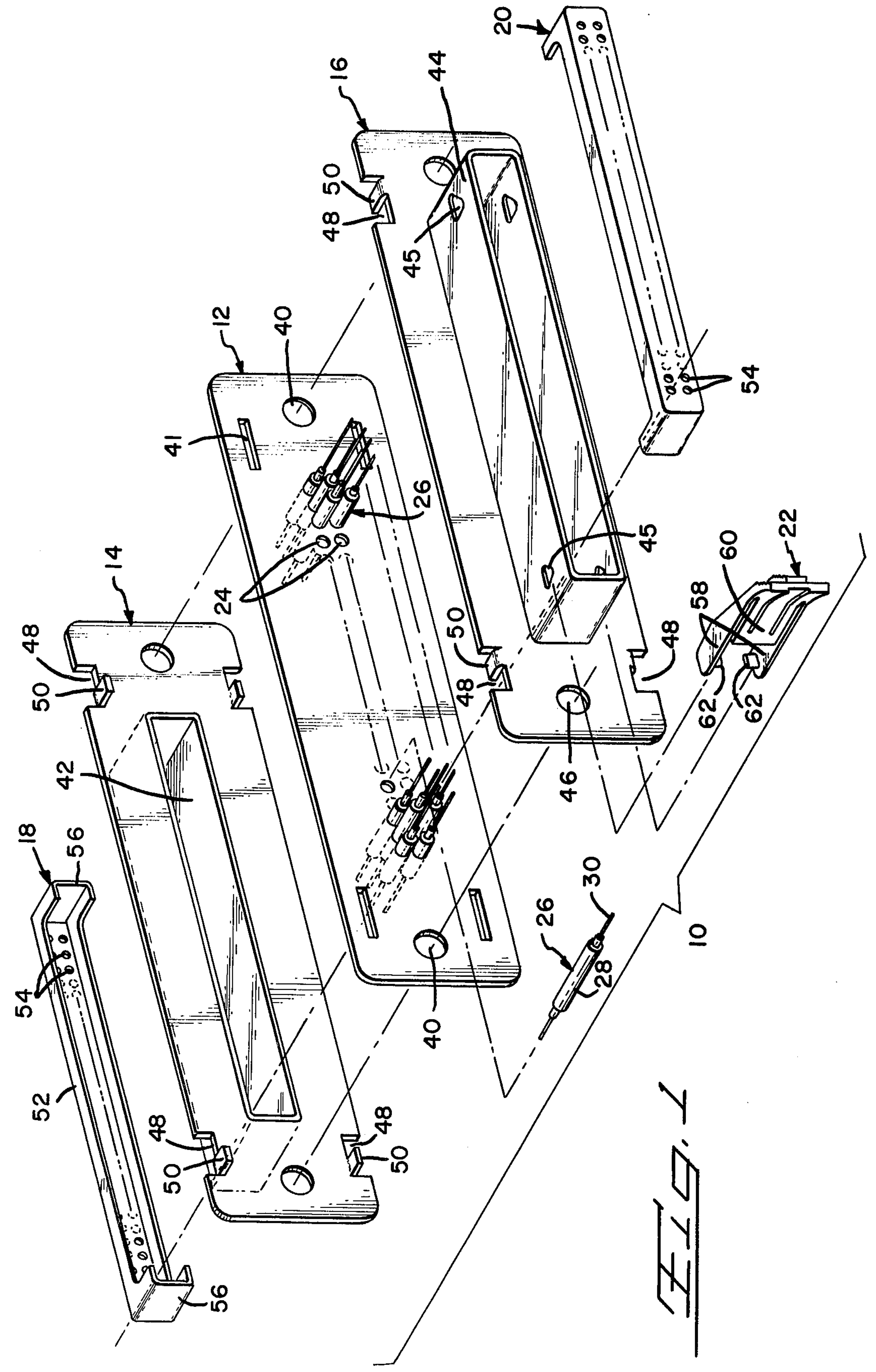
FIG. 1 is an exploded perspective view of the present filtered connector assembly prior to assembly.

Referring first to FIG. 1, the subject adapter assembly 10 is shown to comprise a ground plate 12, a pair of mounting flange plates 14, 16, a pair of elongate dielectric members 18, 20, and four latching ejector members 22 (one of which being shown). The ground plate 12 is provided with a plurality of apertures 24 therethrough arranged generally intermediate of the sides of the ground plate, each aperture 24 being intended to receive a single filter-pin subassembly 26 therethrough. As shown, each filter pin subassembly 26 comprises a ceramic filter sleeve 28 receiving a step profile pin member 30 therethrough. A soldering operation but not necessarily limited to soldering, establishes electrical contact between a given filter sleeve and its corresponding pin member. The pin members 30 (FIG. 3) each are adapted to provide forward and rearward portions 32, 33 of generally smaller diameter, an intermediate portion 34 of generally larger diameter, and integral steps 36 between said portions. While the forward and rearward portions 32, 33 are respectively shown to have equal diameters, such a specification is not required for the purposes of present invention. As shown best by FIG. 3, any given filter sleeve 28 can have a length variable within limits, with the maximum length being that of a pin member intermediate portion 34. The filter-pin members 36 are received within the ground plate apertures 24, and the filter sleeves 28 are subsequently soldered to the ground plate as indicated by numeral 38. While the subject filter-pin subassemblies are described above as being assembled prior to insertion into the ground plate, it should be appreciated that the filter sleeve, pins, and ground plate may be soldered simultaneously in one single operation, if so desired. The ground plate 12 (FIG. 1) is further provided with mounting apertures 40 adjacent alternate ends as well as a discrete assembly slot 41 proximate each corner. It should be noted that the ground plate 12 and filter-pin subassemblies 26 can be pretested at the preliminary stage of the assembly procedure illustrated by FIG. 1. Such a capability is highly desirable for repairability.

The hermaphroditic flange plates 14, 16, are adapted having a longitudinal slot 42 intermediate the sides and ends thereof, and each plate further includes an outwardly projecting elongate hood portion 44 having profiled apertures 45 in the longitudinal sides thereof for a purpose described below. Continuing, proximate each end of the mounting flange plate is an assembly aperture 46, integral notches 48 in opposite longitudinal sides, and outwardly directed tabs 50 located within the notches 48 as indicated. It will be appreciated that the locking tabs 50 are integrally drawn from mounting plate stock at the inner perimeter of respective notches 48. Also, it should be apparent that the locking tabs 50 of one mounting plate project in compliment to locking tabs of the opposite mounting plate; such arrangement being guaranteed by the hermaphroditic nature of the mounting plates. With continued reference to FIG. 1, each dielectric insert is shown having a mid-section 52 through which a plurality of apertures 54 are provided, and a pair of support legs 56 depending downwardly at opposite ends. The latching-ejector members 22 (FIG. 1) comprise resilient rocker legs 58 depending from a W-shaped web portion 60. Each rocker leg 58 provides an inwardly directed oblong camming projection 62 at the remote end thereof.

Figure 2:
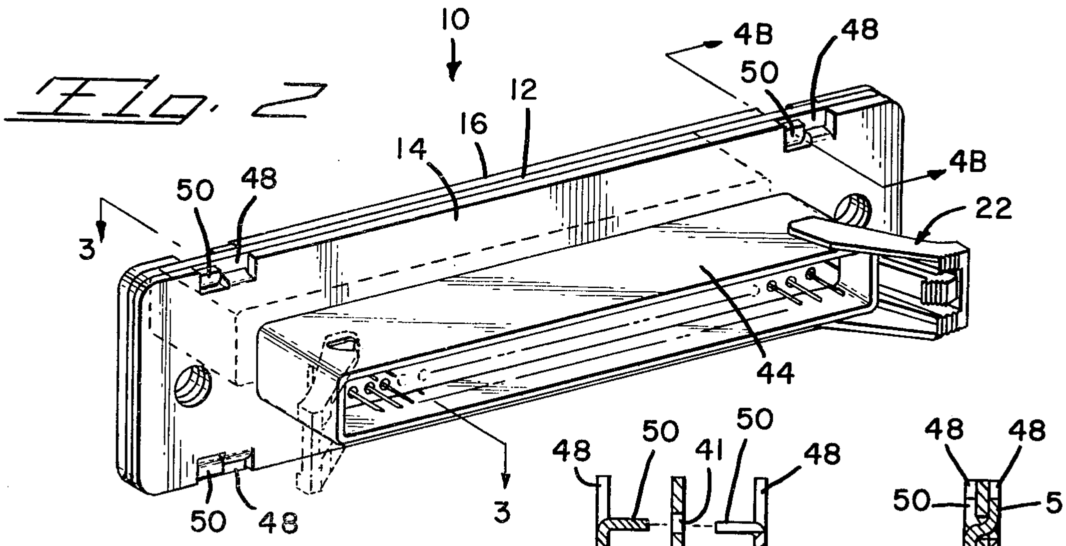
FIG. 2 is an assembled view of the subject filtered connector assembly.
Figure 4:
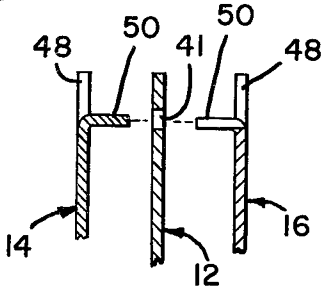
FIG. 4 is an end view of the subject assembly ground plate and mounting plates prior to assembly.
Figure 4B:
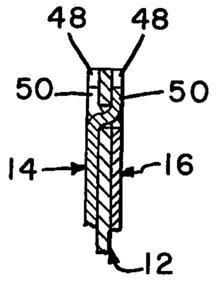
FIG. 4B is an end view of the assembled filtered connector assembly illustrated in FIG. 2, taken along the line 4B—4B.
Figure 3:
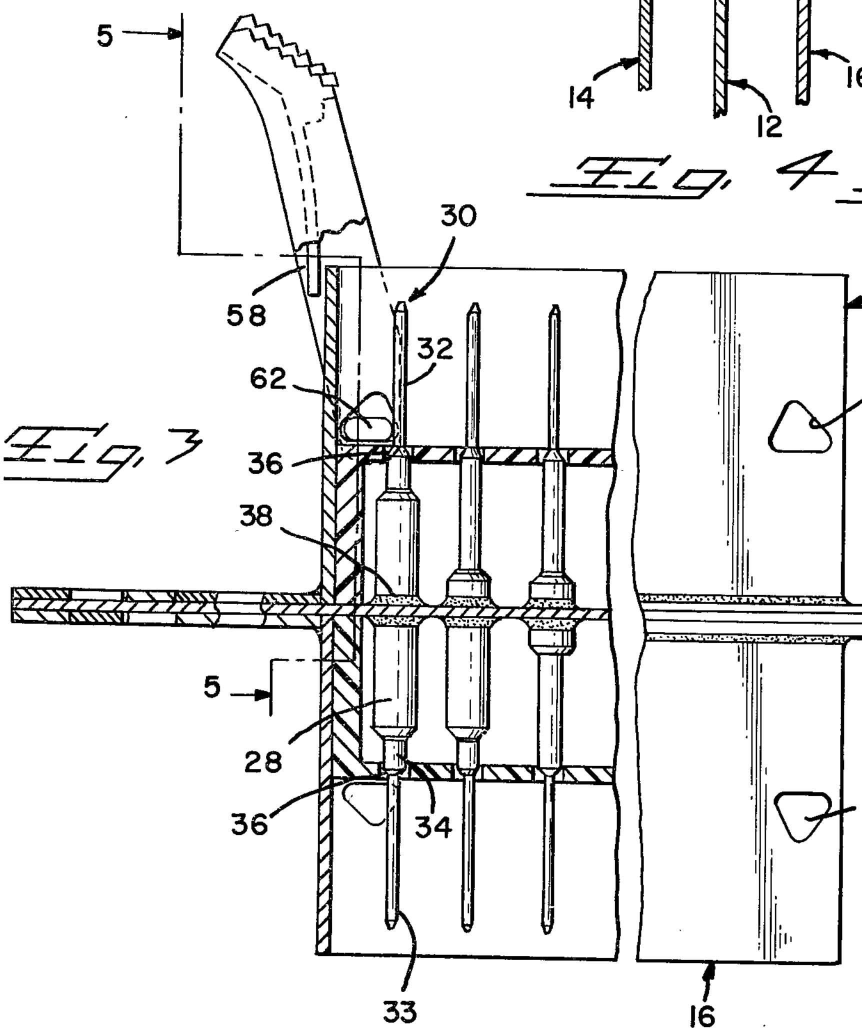
FIG. 3 is a side elevation view partially in section of the subject filtered connector assembly illustrated in FIG. 2, taken along the line 3—3.
Figure 5:
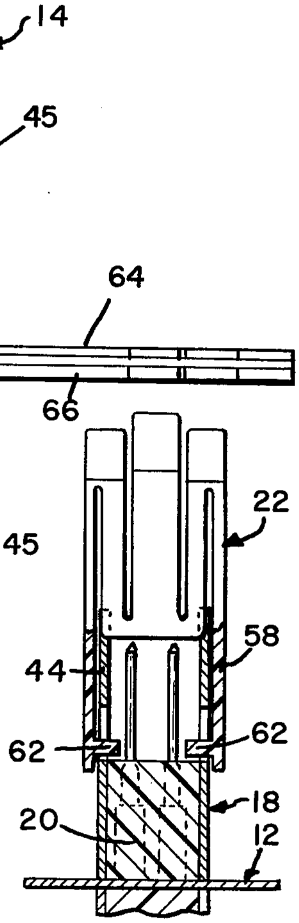
FIG. 5 is an end view of the subject filtered connector assembly taken through the line 5—5 of FIG. 3.

Assembly of the subject invention proceeds as follows. The ground plate apertures 24 are loaded with a plurality of preassembled filter-pin subassemblies 26 (or assembly may be achieved in the optional manner mentioned previously). Since the ground plate and filter-pin members 26 stand alone, preliminary testing can be performed to assure an acceptable ground plate to filter sleeves assembly. Also, preloading the filter-pin members into the ground plate 12, enhances ease of assembly since the ground plate at this point is openly accessable. Subsequently, the outer mounting flange plates 14, 16 are brought into a parallel abutting relationship against opposite faces of the ground plate 12. It will be appreciated from FIGS. 1, 2 and 3, that as the mounting flange plates 14, 16 are brought into the above-described aligned relationship, forward and rearward portions of the filter-pin subassemblies 24 emerge through the mounting plate slots 42 and project outwardly into respective hood portions 44. It will be apparent (FIGS. 4 and 4B) that as the aligned relationship is achieved, the complimentarily directed locking tabs 50 of the mounting plates 14, 16 project through appropriate assembly slots of the ground plate 12, and through the notches 48 of the opposite mounting plate. As best illustrated by FIG. 4B, the locking tabs 50 of the mounting flange plate 16 are then outwardly clasped against the ground plates and into corresponding notches of the opposite mounting plate by appropriate, commonly available tooling (not shown) to securely fix the ground plate between the mounting flange plates. It will readily be appreciated that the above described clasping engagement is achieved without the sacrifice of planarity of the top surface 64 and the bottom surface 66 of the resulting assembly. Preservation of the planar configuration is essential in order for the filtered device to operate effectively. Continuing, the next step in the assembly of the subject invention is the insertion of the dielectric inserts, 18, 20 into respective mounting plate hood portions 44. Such insertion is accomplished as the insert apertures 54 align with the appropriate filter-pin assemblies 24 as illustrated by FIG. 3. Following insertion of the dielectric inserts 18, 20 four latching-ejector members 22 are mounted over the corners of the resulting assembly with the camming projections 62 caused to inwardly protrude through the profiled apertures 45 (FIGS. 3 and 5). The protruding camming projections 62 are thus situated above the inserts 18, 20 to retain the inserts within the mounting flange plate hood portions. The hood portions of each mounting plate are each profiled to receive further connector units therein, said connector units (not shown) being supported, upon insertion, by the camming projections 62. The latching-ejector members are outwardly rotatable, and upon such rotation, the protruding camming projections 62 rotate upwardly within the profiled apertures 65, and disengage the connector units from the filtered connector assembly. The subject completed assembly, illustrated in FIG. 2 and FIG. 3, is intended for bulkhead mounting in a panel or the like.

With reference now to FIG. 3, some general comments are in order. First, it should be appreciated that the longitudinal dimension of the cylindrical filters 26 can vary within a prescribed range of limits. That is, that filter can have a longitudinal length up to a maximum length equal to the pin intermediate portion 32. Variations in the length of the filters is often necessary to selectively vary the filtering characteristics of the interconnected lines. Secondly, the mounting flange plates 14, 16 are hermaphroditic and therefore can be interchangably used to thereby reduce the cost of manufacture of the subject assembly. Thirdly, insertion of the dielectic inserts 18, 20 terminates automatically when the dielectric inserts bottom against the ground plate 12. This positive stop feature is preserved independently of the size of the filters 20. Further, the inserts 18, 20 present a smooth surface within the mounting plates and electrically insulate the filter-pin members within the device.

While the above description of the preferred embodiment exemplifies the principles of the subject invention, other embodiments which will be apparent to one skilled in the art and which utilize the teachings herein set forth are intended to be within the scope and spirit of the subject invention.

What is claimed is:

1. A filtered connector assembly comprising:

an elongate ground plate having filtered pin means centrally disposed therethrough and discrete longitudinal slot means adjacent opposite ends;

a pair of identical elongate mounting plates abutting opposite faces of said ground plate in an aligned relationship, and each said mounting plate having notch means adjacent each end, and integral tab means adjacent each end directed inwardly through said ground plate slot means in complementary position with said opposite mounting plate tab means, and said tab means having remote ends folded into said opposite mounting plate notch means and against an opposite said face of said ground plate to hold said ground and said mounting plates in said aligned relationship.

2. The connector assembly as set forth in claim 1, wherein said folded over remote ends of said mounting plate tab means being coplanar with said opposite mounting plate.

3. The connector assembly as set forth in claim 1, wherein said mounting plate notch means comprising a pair of rectangularly profiled notches within opposite longitudinal sides of said mounting plates, and said tab means comprising integral tabs each directed inwardly from the perimeter of one said mounting plate notch to project through a portion of said ground plate slot means in one direction, each said tab within said slot means being adjacent a complementarily located tab of the opposite said mounting plate projecting through said ground plate slot means in a direction opposite said one direction.

4. A filtered connector assembly comprising:

an elongate ground plate having an array of apertures located centrally therethrough and having discrete longitudinal slot means adjacent opposite ends;

a plurality of filter-pin members each located through one of said array apertures generally perpendicularly of said ground plate;

a pair of elongate mounting plates abutting opposite faces of said ground plate in an aligned relationship, and each said mounting plate having a discrete longitudinal opening located centrally thereof, an elongate outwardly projecting profiled hood portion peripherally outlining said opening and receiving respective filter-pin member extremities therein, notch means adjacent each end, and integral tab means adjacent each end directed inwardly through said ground plate slot means in complementary position with said opposite mounting plate tab means, and said tab means having remote ends folded into said opposite mounting plate notch means and against an opposite said face of said ground plate to hold said ground and said mounting plates in said aligned relationship.

5. The connector assembly as set forth in claim 4, wherein said folded over remote ends of said mounting plate tab means being coplanar with said opposite mounting plate.

6. The connector assembly as set forth in claim 4, wherein said mounting plate notch means comprising a pair of rectangularly profiled notches within opposite longitudinal sides of said mounting plates, and said tab means comprising integral tabs each directed inwardly from the perimeter of one said mounting plate notch to project through a portion of said ground plate slot means in one direction, each said tab within said slot means being adjacent a complementarily located tab of the opposite said mounting plate projecting through said ground plate slot means in a direction opposite said one direction.

7. The connector assembly as set forth in claim 4, wherein each said filter-pin member comprises a pin of stepped profile having a forward extreme portion of a smaller diameter, an intermediate portion of a larger diameter, and a rearward extreme portion of a smaller diameter with integral steps between said portions, and a filter sleeve of a preselected length variable within limits receiving a corresponding said pin intermediate portion therethrough in electrical engagement therewith.

8. The connector assembly as set forth in claim 7, wherein said filter sleeves preselected length having a maximum limit equalling the axial length of said corresponding pin intermediate portion.

9. The connector assembly as set forth in claim 7, said assembly further comprising first and second elongate dielectric insert members, each dimensioned for receipt within a respective said mounting plate hood portion and having a plurality of apertures therethrough each dimensioned and arranged to receive one said smaller diametered extreme pin portion therethrough, with said insert members each having depending means bottoming against said opposite ground plate faces.

10. The connector assembly as set forth in claim 9, each said mounting plate hood portion having longitudinal side walls each having a profiled aperture therein proximate each end thereof, and said assembly further comprising a plurality of retention members each mountable over one said end of each said hood portion, and each said retention members having inwardly directed projections directed through said profiled hood portion apertures in superior relationship to said inserted dielectric members for retaining said dielectric members within respective said hood portions.

11. A connector assembly comprising:

an elongate contact retention plate having at least one discrete longitudinal slot extending therethrough;

a pair of elongate mounting plates each abutting a respective face of said retention plate, and each having a notch aligned with said retention plate slot and an integral tab projection directed inwardly through said retention plate slot in adjacent complementary position with said tab projection of said opposite mounting plate;

each said tab projections having a remote end folded into said notch of said opposite mounting plate and against the opposite said face of said retention plate to hold said retention and mounting plates in assembled relationship.

12. An assembly as set forth in claim 11, wherein said tab projection of each said mounting plate projecting perpendicularly from the periphery of said notch of said mounting plate.

13. An assembly as set forth in claim 11, wherein said remote ends of each said tab projection being coplanar with said opposite mounting plate.

* * * * *